United States Patent
Kanazawa et al.

[11] Patent Number: 6,144,202
[45] Date of Patent: Nov. 7, 2000

[54] REDUCTION OF MR IMAGE DEGRADATION DUE TO ADDED GRADIENT FIELD PULSE

[75] Inventors: Hitoshi Kanazawa, Utsunomiya; Hiroshi Takai, Tochigi-ken, both of Japan

[73] Assignee: Kabushiki Kaisha Toshiba, Kawasaki, Japan

[21] Appl. No.: 09/037,039

[22] Filed: Mar. 9, 1998

[30] Foreign Application Priority Data

Apr. 10, 1997 [JP] Japan .................................. 9-092373

[51] Int. Cl.[7] .................................................. G01V 3/00
[52] U.S. Cl. ........................ 324/309; 324/313; 324/307
[58] Field of Search ..................................... 324/300–322

[56] References Cited

U.S. PATENT DOCUMENTS

| | | |
|---|---|---|
| 4,516,075 | 5/1985 | Moran . |
| 4,885,542 | 12/1989 | Yao et al. ............................. 324/313 |
| 5,450,010 | 9/1995 | Van Der Meulen et al. .......... 324/309 |
| 5,455,512 | 10/1995 | Groen et al. .......................... 324/309 |

OTHER PUBLICATIONS

Stejsakl EO, Tanner JE. Spin Diffusion measurements: spin echoes in the presence of a time dependent field gradient, J. of Chem. Phys 1965, 42:288–292 H.K. Feb. 9, 1998.

*Primary Examiner*—Christine K. Oda
*Assistant Examiner*—Tiffany A. Fetzner
*Attorney, Agent, or Firm*—Nixon & Vanderhye P.C.

[57] ABSTRACT

A pair of gradient field pulses of the same applied time and the same intensity are applied before and after a radio-frequency (RF) refocusing pulse (180° pulse) as additional gradient field pulses to enhance the phase shift of a transverse magnetization spin, caused by the diffusion of a molecule including a target nuclide. To compensate for image deterioration caused by an unnecessary field distribution which is produced by the additional gradient field pulses, a compensation gradient field pulse dGcp and a compensation offset gradient field dGoffset are applied and a center frequency at the time of receiving and detecting an echo signal is shifted by $df_0$.

32 Claims, 11 Drawing Sheets

REDUCTION OF MR IMAGE DEGRADATION DUE TO ADDED GRADIENT FIELD PULSE

BACKGROUND OF THE INVENTION

1. Field of the Invention

The present invention relates to a magnetic resonance imaging (MRI) apparatus which applies an additional gradient field pulse in addition to a gradient field necessary for imaging.

2. Related Priority Application

This application is based on Japanese Patent Application No. 9-92373, filed Apr. 10, 1997, the content of which is incorporated herein by reference.

3. Related Art

FIGS. 12 and 13 illustrate pulse sequences of a spin echo (SE) scheme and echo planar imaging (EPI) scheme, two typical imaging schemes which are employed in MRI apparatuses. By properly setting the repetition time (TR) and echo time (TE) in those imaging schemes, T1 or T2 of a target nuclide or the density of a target nuclide itself is reflected on the signal value of an image of interest.

Further, an image is provided with specific information by applying an additional gradient field pulse during a period from the application of an excitation pulse to the echo data acquisition.

FIGS. 14A through 14C exemplify additional gradient field pulses. FIG. 14A depicts a pulse sequence in an SE scheme, and FIG. 14B shows a motion probing gradient (Gmo) pulse which is an additional gradient field pulse for enhancing a phase shift in a transverse magnetization spin caused by the minute motion of a molecule including a target nuclide in each image pixel. The Gmo pulse is a pair of gradient field pulses of the same applied time and the same intensity, which are to be applied before and after a radiofrequency (RF) refocusing pulse (180° pulse) and are used to enhance a phase shift in a transverse magnetization spin caused by the diffusion of a molecule including a target nuclide. Such an MPG pulse is disclosed in, for example, a reference document by Stejscal EO, Tanner JE., entitled "Spin Diffusion Measurements: Spin Echoes in the Presence of a Time Dependent Field Gradient, J. of Chemical Physics, 1965, 42: pp 288–299. The imaging scheme which enhances a phase shift in a transverse magnetization spin, originated from the minute motion of a molecule in a same voxel by the application of such additional gradient field pulses, is called IVIM (Intra Voxel Incoherent Motion) imaging.

FIG. 14C shows a flow encode gradient (Gfe) pulse, an additional gradient field pulse for changing the phase of a transverse magnetization spin in proportion to the speed of an imaging target. The specification of U.S. Pat. No. 4,516,075 by Moran discloses an imaging scheme which uses this Gfe pulse.

Each of those additional gradient field pulses like the FEG pulse and Gfe pulse consists of a pulse of one of the frequency encode direction, phase encode direction and slice direction, or consists of a pulse acquired by combining pulses of those directions at a given ratio. The direction for applying an additional gradient field pulse and the intensity of the pulse are set in accordance with the speed and direction of an imaging target to be observed, independently of the image resolution and the slice direction.

Problems of incompleteness which are due to the application of additional gradient field pulses will now be discussed. One of such problems is the occurrence of an unnecessary field distribution.

When the speed of an imaging target of interest is slow, the intensity of an additional gradient field pulse should be increased independently of the gradient field that is necessary for imaging. When an Gmo pulse is used, particularly, its intensity has to be increased significantly; in some cases, Gmo pulses of the maximum gradient field intensity of an MRI apparatus in use are applied for several scores of milliseconds. The application of such an additional gradient field pulse produces an eddy current. The influence of improper adjustment of an eddy field compensation circuit current causes the distribution of an unnecessary field (eddy field) to occur. There are many reports on the distortion, shifting and blurring of images, a change in phase component of images and the like that originate from the occurrence of this unnecessary field distribution.

An unnecessary field distribution also occurs due to a manufacturing error in the allowance of the gradient field coil (more specifically, this error would appear in the section direction). Therefore, the distribution and intensity of an unnecessary field varies from one apparatus to another, resulting in a variation in image quality apparatus by apparatus. This raises a problem for the quality control of commercial MRI apparatuses which are mass-produced.

The above-described occurrence of an unnecessary field distribution is particularly critical in the aforementioned EPI.

IVIM imaging using MPG typically employs EPI to reduce artifacts produced by body motion, CSF (CerebroSpinal Fluid) and pulsation of the bloodstream or the like. From the principle viewpoint, EPI is a sequence especially sensitive to incompleteness, such as the occurrence of an unnecessary field distribution. When MPG is used, for example, as a large gradient field is used in imaging, even the use of a shield type gradient field coil, which is generally said to produce a small eddy current, generates an eddy current too large to be negligible in EPI. The distribution of an unnecessary field (eddy field) due to this eddy current appears as obvious image distortion in EPI even if the residual eddy current is small. This shortcoming is described in another reference document entitled "Correction for Distortion of Images Used to Calculate the Apparent Diffusion Coefficient," Proc. of the 4th Annual Meeting, International Society of Magnetic Resonance in Medicine, 1996, No. 1335. Further, an image obtained by applying an MPG pulse differs in image distortion and shifting from an image acquired without application of an MPG pulse. This leads to such an inconvenience that in comparing both images, it is difficult to specify corresponding positions or that both images cannot be displayed one over the other.

Some imaging schemes acquire extra echo data, besides echoes needed for image reconstruction, as compensation data and compensate various kinds of incompleteness using this compensation data. Here, an unnecessary field distribution produced by a strong additional gradient field pulse reduces the signal value of compensation echo data, which increases artifacts of images like ghost, thus lowering the compensation precision.

As discussed above, application of an additional gradient field pulse undesirably produces an unnecessary field distribution which results in degradation of an image quality, such as image distortion, positional shifting or artifacts produced by reduction of the signal value of compensation echo data.

BRIEF SUMMARY OF THE INVENTION

It is an object of the present invention to provide a magnetic resonance imaging apparatus capable of reducing degradation of image quality caused by an unnecessary field distribution which is produced by application of an additional gradient field pulse.

According to one aspect of the invention, there is provided a magnetic resonance imaging apparatus comprising:

first application means for applying an additional gradient field pulse in addition to a gradient field necessary for imaging; and second application means for applying a compensation gradient field for compensating for image deterioration caused by application of the additional gradient field pulse by the first application means.

According to the apparatus, image distortion and positional shift which occur due to application of an additional gradient field pulse by first application means can be suppressed because of the application of the compensation gradient field by second application means.

Additional objects and advantages of the invention will be set forth in the description which follows, and in part will be obvious from the description, or may be earned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Magnetic resonance imaging (MRI) apparatuses according to preferred embodiments of the present invention will now be described with reference to the accompanying drawings.

First Embodiment

Figure 1:
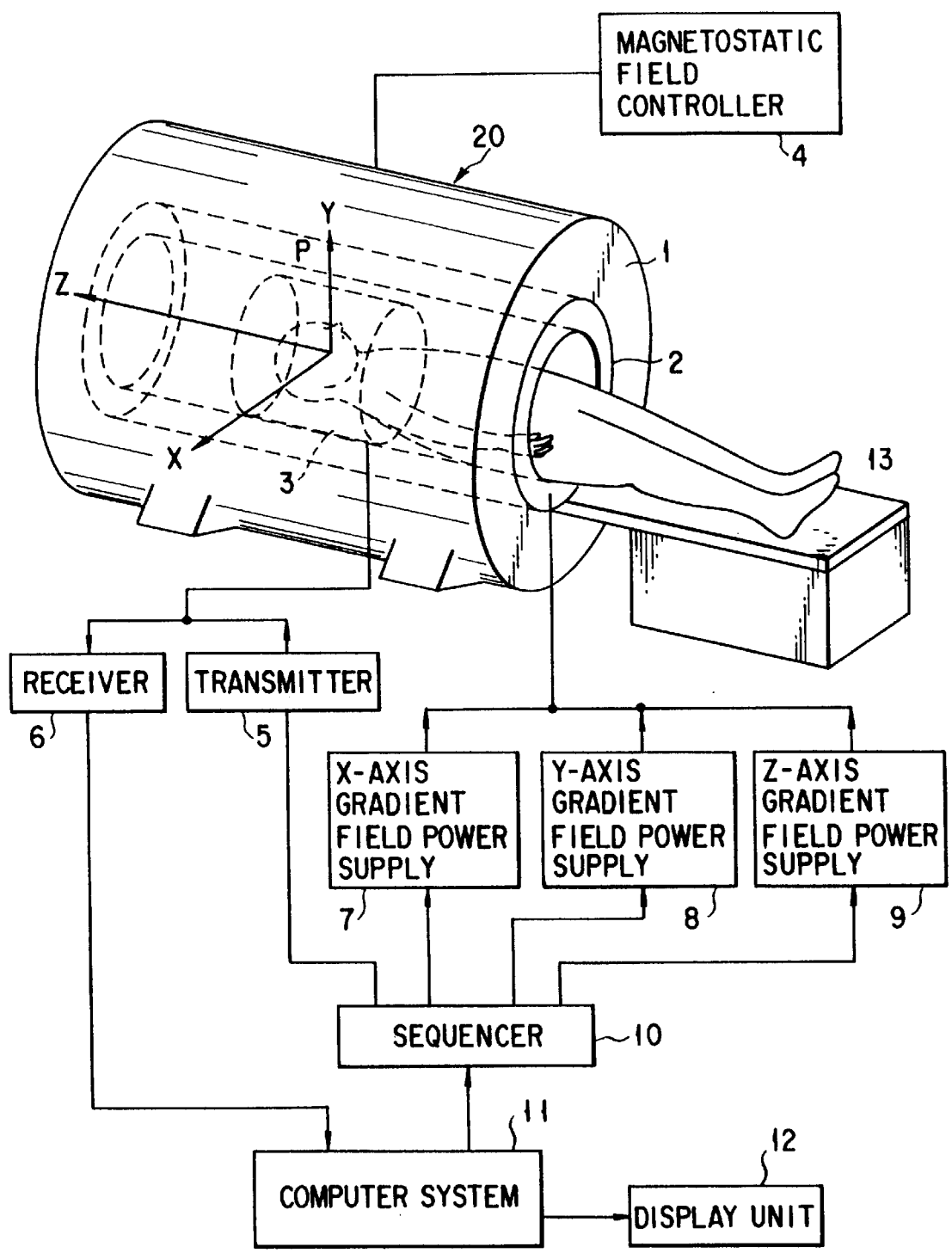
FIG. 1 is a block diagram illustrating the hardware structure of an MRI apparatus according to a first embodiment of this invention.

FIG. 1 presents a block diagram illustrating the hardware structure of an MRI apparatus. Provided inside a gantry 20 are a magnetostatic field magnet 1, X-axis·Y-axis·Z-axis gradient field coils 2 and a transmission and reception coil 3. The transmission and reception coil 3 may be buried in the platform of a bed 13, not in the gantry, or may be directly attached to a subject body. The transmission and reception coil 3 may be replaced with separate coils exclusively for transmission and reception. The magnetostatic field magnet 1 as an MRI apparatus is constituted by using, for example, a super conductive coil or a normal conductive coil. The X-axis·Y-axis·Z-axis gradient field coils 2 serve to generate an X-axis gradient field Gx, a Y-axis gradient field Gy and a Z-axis gradient field Gz. The transmission and reception coil 3 is used to generate a radio frequency (RF) pulse as a select excitation pulse for selecting a slice and detect a magnetic resonance (MR) signal which is generated by magnetic resonance. A subject body P laid on the platform of the bed 13 is inserted in an imaging volume in the gantry 20 (a spherical area where a field for imaging is formed and where diagnosis is possible).

The magnetostatic field magnet 1 is driven by a magnetostatic field controller 4. The transmission and reception coil 3 is driven by a transmitter 5 at the time of RF transmission, and is coupled to a receiver 6 at the time of detecting an MR signal. The X-axis·Y-axis·Z-axis gradient field coils 2 are driven by an X-axis gradient field power supply 7, a Y-axis gradient field power supply 8 and a Z-axis gradient field power supply 9.

The X-axis gradient field power supply 7, the Y-axis gradient field power supply 8, the Z-axis gradient field power supply 9 and the transmitter 5 are driven in a predetermined sequence by a sequencer 10, and generate an X-axis gradient field Gx, a Y-axis gradient field Gy, a Z-axis gradient field Gz and an RF pulse in a predetermined sequence which will be discussed later. In this case, the X-axis gradient field Gx, Y-axis gradient field Gy and Z-axis gradient field Gz are mainly used as, for example, a phase encoding gradient field Gpe, a read gradient field Gro and a slice select gradient field Gss, respectively. A computer system 11 controls the driving of the sequence 10, performs predetermined signal processing on an MR signal received at and from the receiver 6 to generate a tomographic image of the subject body, and displays the image on a display unit 12.

Figure 2:
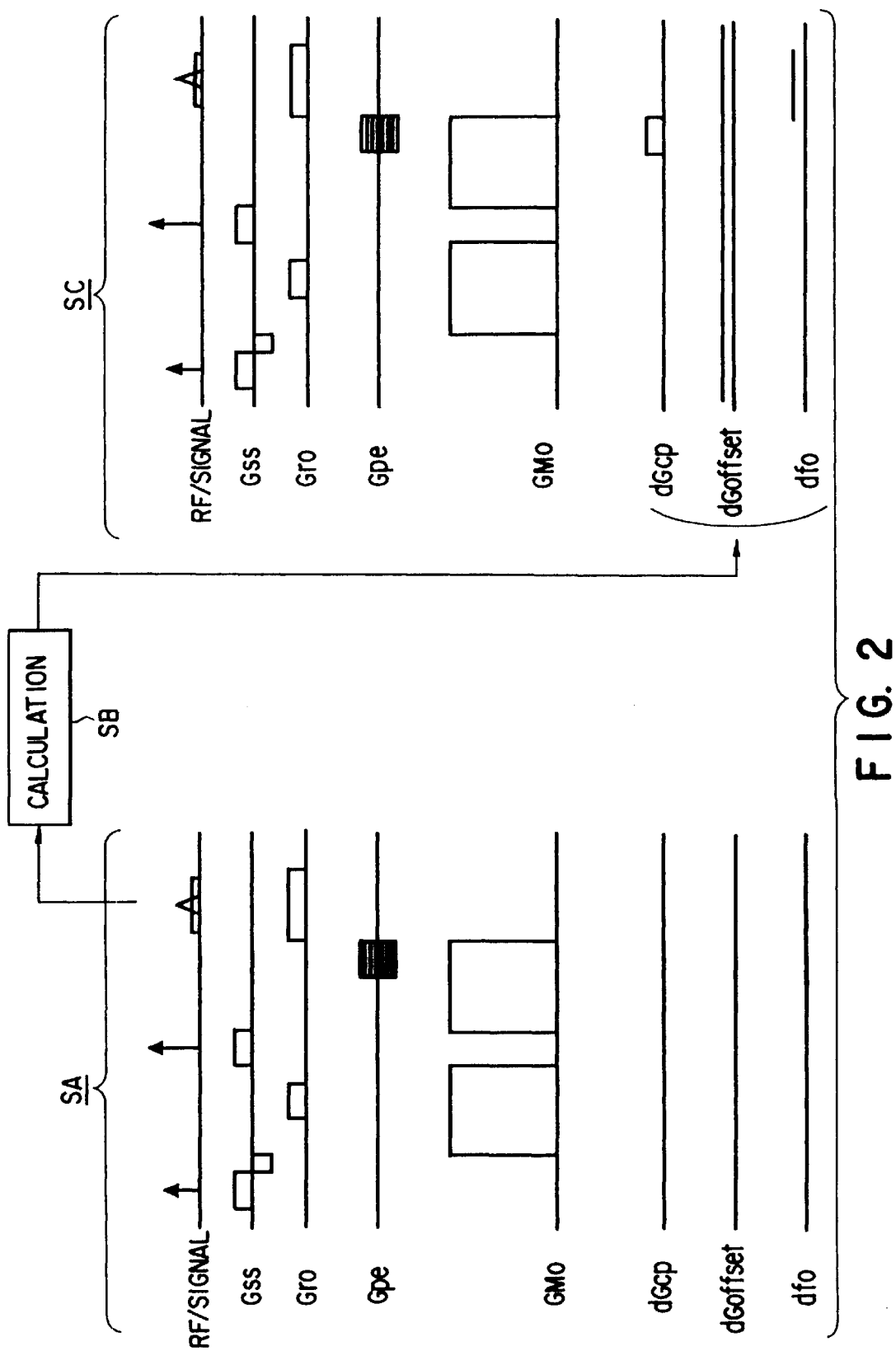
FIG. 2 is a diagram schematically showing the operation of the MRI apparatus according to this invention.

FIG. 2 schematically shows the operation of this embodiment.

The MRI apparatus according to this embodiment, as shown in FIG. 2, executes a sequence SA to compute compensation data (sequence SC), and then performs a sequence SC. The sequence SA is for measuring the pattern (represented by a model having several kinds of coefficients) of an unnecessary field distribution, which can be generated in the apparatus by an applied additional gradient field pulse, as coefficients of that apparatus. More specifically, the sequence SA is to measure parameters to be discussed later.

The sequence SA need not be executed every time actual imaging is carried out. For instance, the results of measuring those parameters only once at the time the apparatus is installed may be used in subsequent imaging.

In the computation of compensation data (SB), compensation data to be used in the sequence SC is calculated. The compensation data gives a compensation gradient field pulse, a compensation offset gradient field and a shift amount of the center frequency at the time of receiving and detecting an echo signal.

The sequence SC is what is performed every time the subject body is actually imaged.

In the sequences SA and SC illustrated in FIG. 2, RF/Signal denotes an RF transmission signal and echo signal, Gss is a slice select gradient field, Gro is a read gradient field and Gpe is a phase encoding gradient field.

Further, GMo is a motion probing gradient pulse as one example of additional gradient field pulses. This GMo is a pair of gradient field pulses of the same applied time and the same intensity, which are used to enhance the phase shift of a transverse magnetization spin, caused by the diffusion of a molecule including a target nuclide, and are applied before and after a radio-frequency (RF) refocusing pulse (180° pulse).

Figure 13:
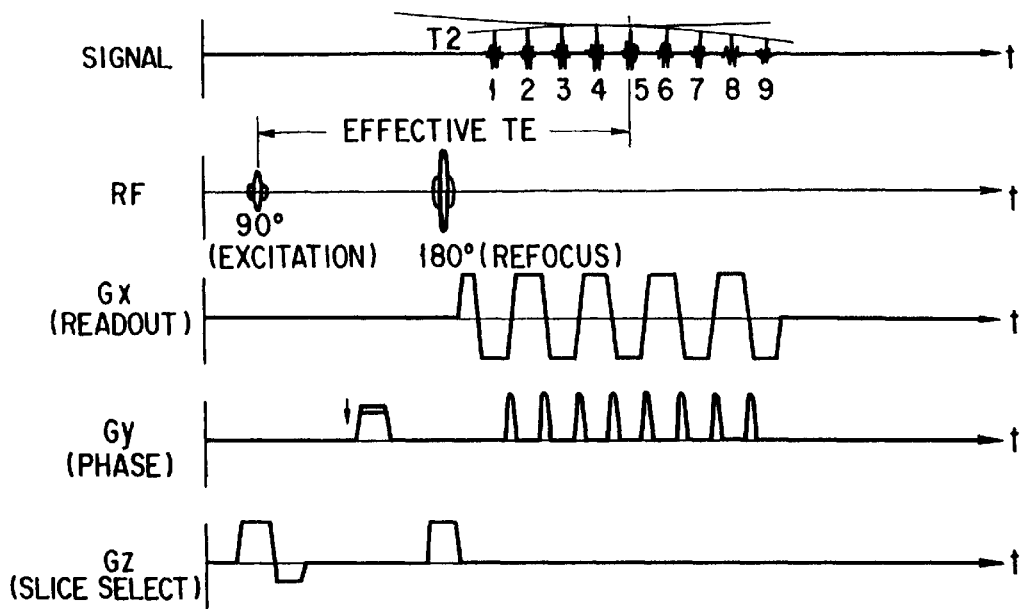
FIG. 13 is a diagram showing a pulse sequence of an echo planar imaging scheme according to prior art.
Figure 14A:
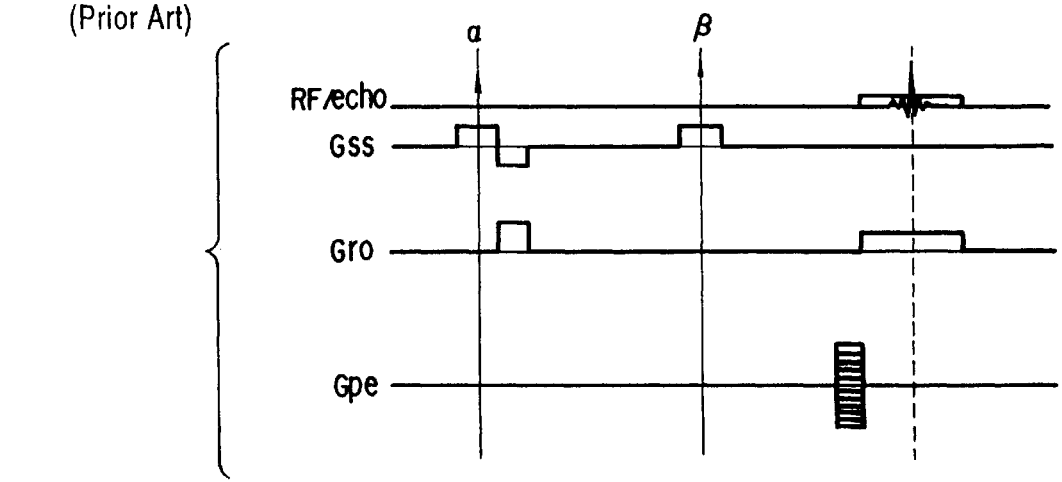
FIGS. 14A through 14C are diagrams illustrating application of additional gradient field pulses according to prior art.
Figure 14B:
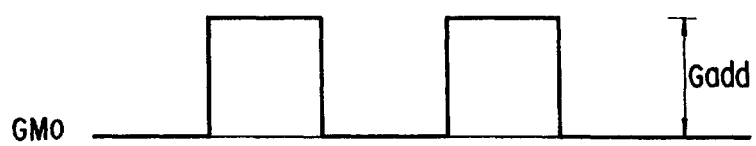
Figure 14C:
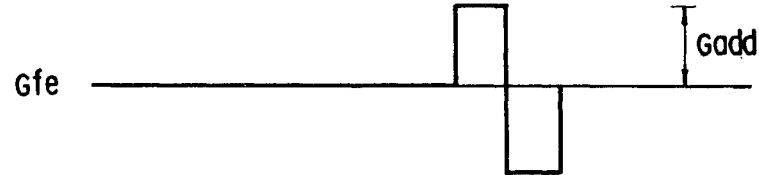

There are a plurality of known additional gradient field pulses, such as the motion probing gradient pulse GMo and a flow encode pulse Gfe shown in FIG. 13, which can be used separately in accordance with the imaging purpose.

dGcp is a compensation gradient field pulse, dGoffset is a compensation offset gradient field and $df_0$ is the shift amount of the center frequency at the time of receiving and detecting an echo signal.

Figure 3:
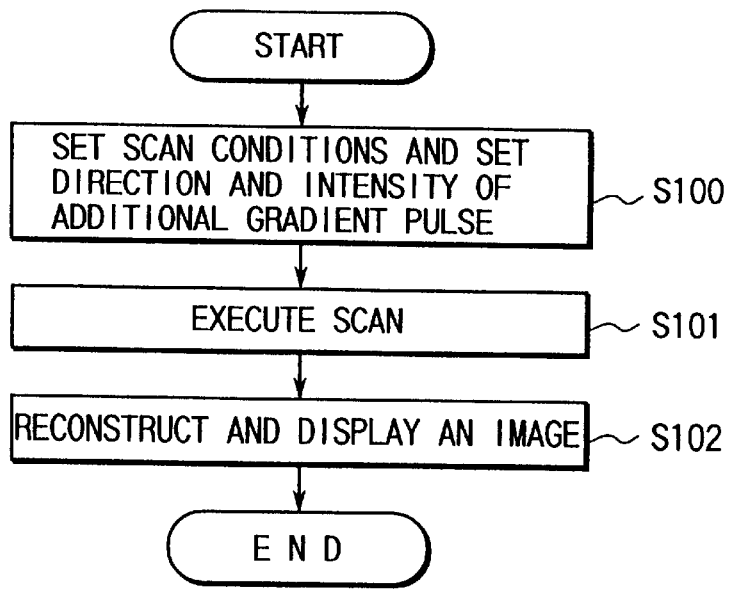
FIG. 3 is a flow chart illustrating imaging procedures in a conventional MRI apparatus as a comparative example to this invention.

FIG. 3 is a flow chart illustrating specific imaging procedures in a conventional MRI apparatus as a comparative example to this invention. This imaging sequence comprises step S100 of setting scan conditions and setting the application direction and the intensity of the aforementioned additional gradient field pulse, step S101 of applying the additional gradient field pulse to perform scanning, and step S102 of reconstructing an image based on the scan result and displaying this image. The setting of the scan conditions in step S100 includes setting of the section direction, repetition time (TR) and echo time (TE) and the number of slices. Normally, the setting in step S100 is based on the contents of an instruction given by an operator.

Figure 4:
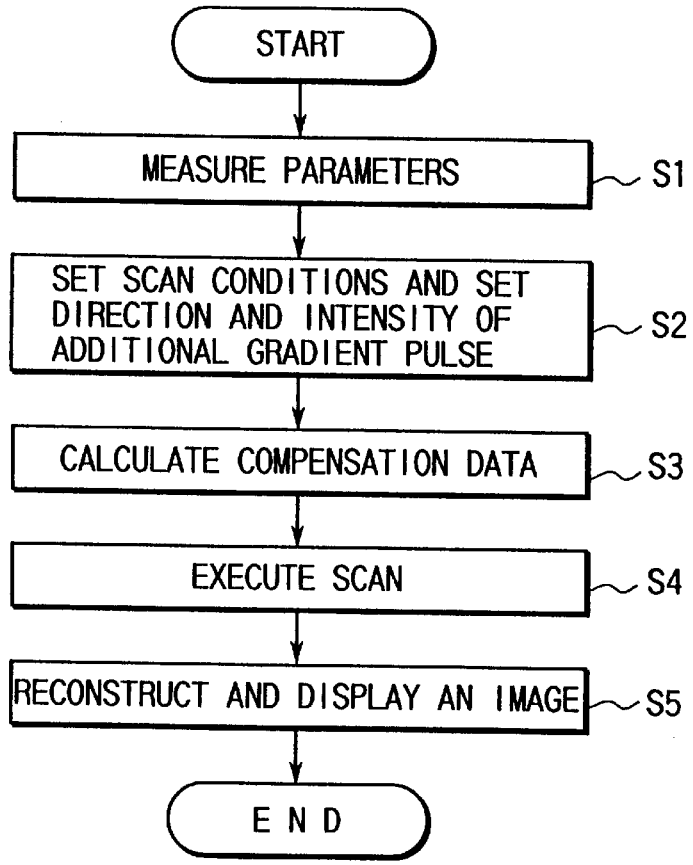
FIG. 4 is a flow chart showing imaging procedures of the first embodiment.

FIG. 4 is a flow chart illustrating specific imaging procedures in an MRI apparatus according to this invention. The imaging sequence of this invention comprises step S1 of measuring parameters which are used to compensate an unnecessary field distribution, step S2 of setting scan conditions and setting the application direction and the intensity of the aforementioned additional gradient field pulse, step S3 of computing compensation data according to the set additional gradient field pulse using the set parameters, step S4 of executing scan in accordance with a pulse sequence, which includes application of the additional gradient field pulse and compensation for an unnecessary field distribution, and step S5 of reconstructing an image based on the scan result and displaying this image.

The setting scan conditions and setting the application direction and the intensity of the aforementioned additional gradient field pulse in step S2 is the same as that in the conventional imaging sequence shown in FIG. 3. A specific way of computing compensation data in step S3 will be discussed later.

According to the thus designed imaging sequence of this invention, as the motion probing gradient pulse GMo is used as an additional gradient field pulse in accordance with the pulse sequence SC shown in FIG. 2, the phase shift of a transverse magnetization spin, which is caused by the minute motion of a molecule including a target nuclide in each image pixel, can be enhanced.

Further, the compensation gradient field pulse and compensation offset gradient field are applied to shift only the center frequency at the time of receiving and detecting an echo signal. It is therefore possible to compensate for degradation of image quality, which is caused by an unnecessary field distribution produced by the additional gradient field pulse.

As apparent from FIG. 2, compensation for an unnecessary field distribution is performed by the pulse sequence itself in this embodiment. Known calculation schemes may be used in the post processing of echo data and the reconstruction process. Such a compensating process may be accomplished by another method which does not involve the alteration of the pulse sequence itself. That is, the compensating process may be implemented by the deformation of a reconstructed image, shift in the frequency encode direction and shift in the phase encode direction. In particular, compensation by an image reconstructing process will be discussed in a later section of a third embodiment.

A specific way of calculating compensation data will now be described.

A vector Gadd indicating the motion probing gradient pulse GMo shown in FIG. 2 or the flow encode pulse Gfe (see FIG. 13) will be given by the following equation (1). Note that the vector will be hereinafter expressed by an identifier "*". For example, the vector Gadd is denoted by *Gadd.

$$*Gadd = \begin{pmatrix} Gadd, r \\ Gadd, e \\ Gadd, s \end{pmatrix} \quad (1)$$

Gadd,r, Gadd,e and Gadd,s are the gradient field intensities [T/m] in the frequency encode direction, the phase encode direction and the slice direction, respectively.

The vector of the compensation offset gradient field shown in FIG. 2 is denoted by *dGoffset and the vector of the compensation gradient field pulse is denoted by *dGcp. It is typical that the gradient field system is defined by gradient fields of three channels. The gradient fields of the individual channels perpendicularly intersect one another and their field intensities (normally magnetostatic directional components) exhibit linear gradient.

In this respect, *dGoffset and *dGcp are to be defined as vectors each having elements for the individual channels, or three channels x, y and z, of the gradient field system in use. The following equation (2) gives *dGoffset and *dGcp.

$$*dGoffset = \begin{pmatrix} dGoffset, x \\ dGoffset, y \\ dGoffset, z \end{pmatrix} \quad (2)$$

-continued $$*dGcp = \begin{pmatrix} dGcp, x \\ dGcp, y \\ dGcp, z \end{pmatrix}$$

dGoffset,x, dGoffset,y and dGoffset,z are the intensities [T/m] of compensation offset gradient fields of x, y and z channels, respectively, and dGcp,x, dGcp,y and dGcp,z are the intensities [T/m] of compensation gradient field pulses of x, y and z channels, respectively. Note that the shift amount $df_0$ of the center frequency at the time of receiving an echo signal has a unit of "Hz."

The correlation between *Gadd and those compensation amounts *dGoffset, *dGcp and $df_0$ is given by the following equation (3).

$$*dGoffset = -k_{Goffset} \cdot R \cdot *Gadd$$

$$*dGcp = -k_{Gcp} \cdot R \cdot *Gadd$$

$$df_0 = -k_f \cdot *Gadd \qquad (3)$$

where R is a rotational matrix of three rows by three columns indicating an oblique angle and gives the correlation between the gradient field intensities Gro, Gpe and Gss of the individual channels in the pulse sequence and the gradient field intensities Gx, Gy and Gz of the individual channels in the physical gradient field system as given by the following equation (4).

$$\begin{pmatrix} Gx \\ Gy \\ Gz \end{pmatrix} = R \begin{pmatrix} Gro \\ Gpe \\ Gss \end{pmatrix} \qquad (4)$$

$k_{Goffset}$, $k_{Gcp}$ and $k_f$ are matrices indicating parameters and are given by the following equation (5).

$$k_{Goffset} = \begin{pmatrix} \alpha_{xx} & \alpha_{xy} & \alpha_{xz} \\ \alpha_{yx} & \alpha_{yy} & \alpha_{yz} \\ \alpha_{zx} & \alpha_{zy} & \alpha_{zz} \end{pmatrix} \qquad (5)$$

$$k_{Gcp} = \begin{pmatrix} \beta_{xx} & \beta_{xy} & \beta_{xz} \\ \beta_{yx} & \beta_{yy} & \beta_{yz} \\ \beta_{zx} & \beta_{zy} & \beta_{zz} \end{pmatrix}$$

$$k_f = (\gamma_x \;\; \gamma_y \;\; \gamma_z)$$

Each element $\alpha_{ij}$ indicates the size of the linear field component which is generated in the i direction when a unit gradient field is applied in the j direction, and defines a compensation offset gradient field which has a field component constant along the time axis but linear spatially.

Each element $\beta_{ij}$ represents the shift amount of a time integral value of a gradient field, which is generated in the i direction when a unit gradient field is applied in the j direction, in terms of a gradient field intensity, and defines a compensation gradient field pulse which is applied for a specific time in a period from excitation to echo acquisition and whose intensity's time integral value is not zero.

Each element $\gamma_i$ represents the shift of the center frequency at the time of detecting an echo signal as given from a gradient field of the 0-th order, which is generated when a unit gradient field is applied in the i direction, and defines the shift amount of this center frequency.

It is apparent from those correlations that if the above parameters have been acquired beforehand as compensation coefficient matrices for an apparatus of interest, once the size and direction of an additional gradient field are determined, the shift amounts of the compensation gradient field (compensation gradient field pulse and compensation offset gradient field) and the reception center frequency (the center frequency at the time of receiving and detecting an echo signal) can be calculated.

Although this embodiment has been described with reference to a particular case where considerable image degradation is to be compensated with the compensation gradient field and the reception center frequency, compensation is not limited to this means, but other compensation means can be used as well if there is a correlation between an additional gradient field pulse and a compensation amount.

The following will discuss how to measure the parameters.

Figure 5:
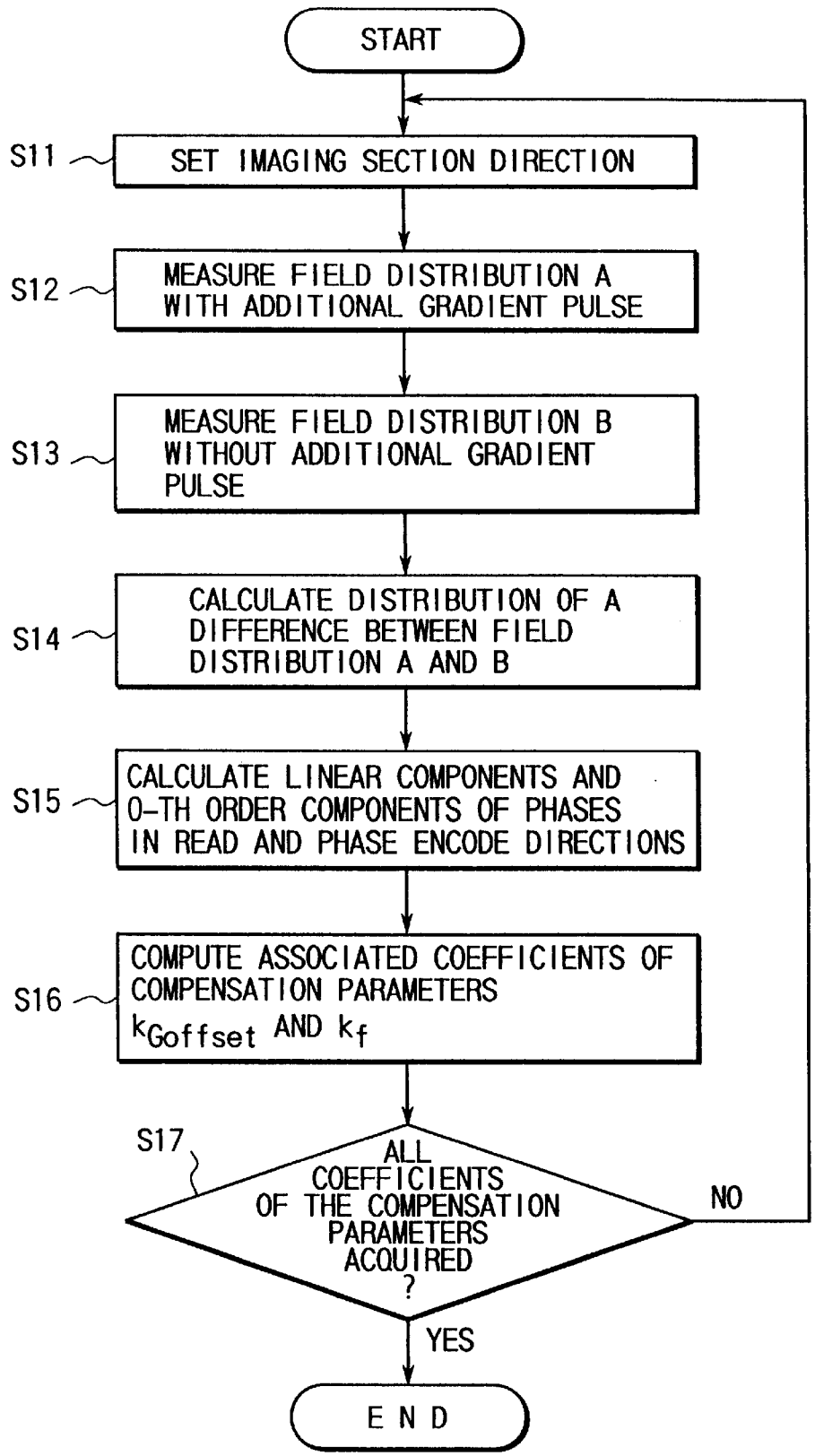
FIG. 5 is a flow chart depicting procedures for acquiring individual elements of $k_{Goffset}$ and $k_f$ in the first embodiment.
Figure 6:
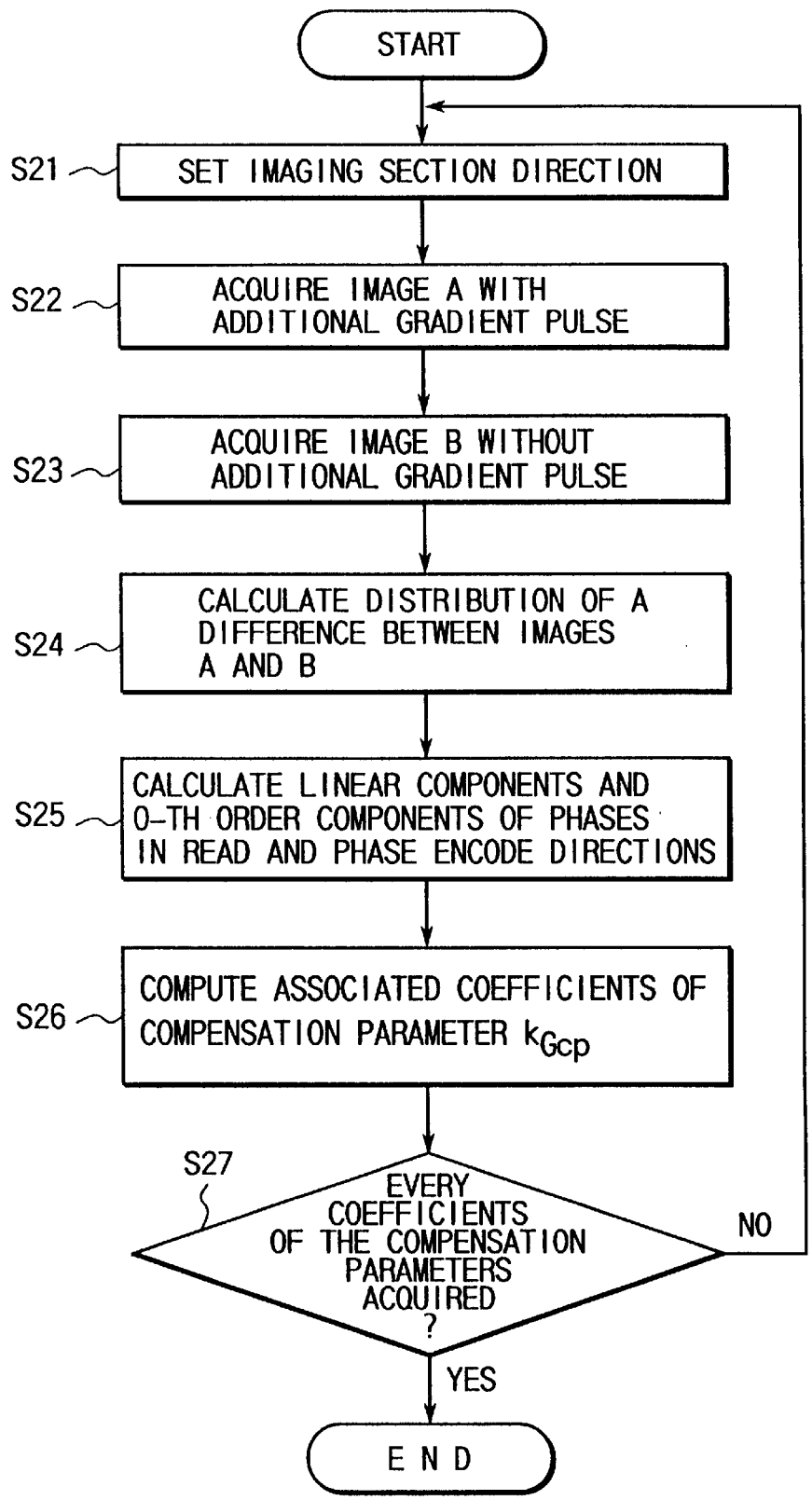
FIG. 6 is a flow chart illustrating procedures for acquiring individual elements of $k_{Gcp}$ in the first embodiment.

FIG. 5 is a flow chart depicting procedures for acquiring individual elements of $k_{Goffset}$ and $k_f$, and FIG. 6 is a flow chart illustrating procedures for acquiring individual elements of $k_{Gcp}$.

The procedures of obtaining the individual elements of $k_{Goffset}$ and $k_f$ as shown in FIG. 5 are carried out as follows. First, the section direction for imaging is set in step S11. Normally, one of three orthogonal sections (axial, coronal and sagital sections) is set. With this imaging section direction set, a field distribution A in a plane is measured by applying an additional gradient field pulse (step S12).

While a field distribution can be measured by a scheme of imaging two kinds of images with different echo times and measuring a field distribution from the phase difference between the two images as proposed in Jpn. Patent Appln. Publication KOKAI No. Sho 61-180130 or Jpn. Patent Appln. Publication KOKAI No. Sho 63-259481, many other methods have already been proposed and any one of them may be used as well.

Further, with the imaging section direction set, a field distribution B in the plane is measured without applying an additional gradient field pulse (step S13). Next, a distribution of the difference between the field distributions A and B is computed (step S14), and the linear components and 0-th order components of the phases in the read and phase encode directions are calculated based on the computed distribution of the difference between field distributions (step S15).

Then, the values of partial elements of $k_{Goffset}$ and $k_f$ are acquired based on the linear components and 0-th order components of the phase components (step S16). This sequence of procedures is repeated while the section direction or the direction of the additional gradient field pulse is changed, until all the coefficients of the compensation parameters are acquired, i.e., all the elements of $k_{Goffset}$ and $k_f$ to be measured are acquired (step S17). Note however that when some of the compensation parameter elements are nearly zero or there is an element which has a small variation from one apparatus to another, measurement of such an element may be omitted.

The procedures for obtaining the individual elements of $k_{Gcp}$ as shown in FIG. 6 are carried out as follows. First, the imaging section direction is set in step S21. While one of three orthogonal sections (axial, coronal and sagital sections) is normally set as the section direction, the same direction as set in step S11 in FIG. 5 is to be set here.

With this imaging section direction set, an image A is imaged by applying an additional gradient field pulse (step S22). The imaging scheme in this case should be an imaging scheme to be compensated for or its equivalent method. Further, with the imaging section direction set, an image B is imaged without applying an additional gradient field pulse (step S23). Next, a distribution of the difference between the images A and B is computed (step S24).

An equation (6) below with pixel values of specific points of the images A and B respectively given by a and b may be used for the computation for acquiring the distribution of the difference between phase components.

$$(a-b) \leftarrow \rightarrow \arg\{(a \cdot b^*)/|a \cdot b^*|\} \quad (6)$$

Based on the computed distribution of the difference between the phase components, the linear components and 0-th order components of the phases in the read and phase encode directions are calculated (step S25). Then, the values of partial elements of $k_{Gcp}$ are acquired based on the linear components and 0-th order components of the phase components (step S26). This sequence of procedures is repeated while the section direction or the direction of the additional gradient field pulse is altered, until all the elements of $k_{Gcp}$ are acquired (step S27). It is to be noted however that for any compensation parameter element which is nearly zero or has a small variation from one apparatus to another, measurement of that element may be omitted as in step S17.

Figure 7:
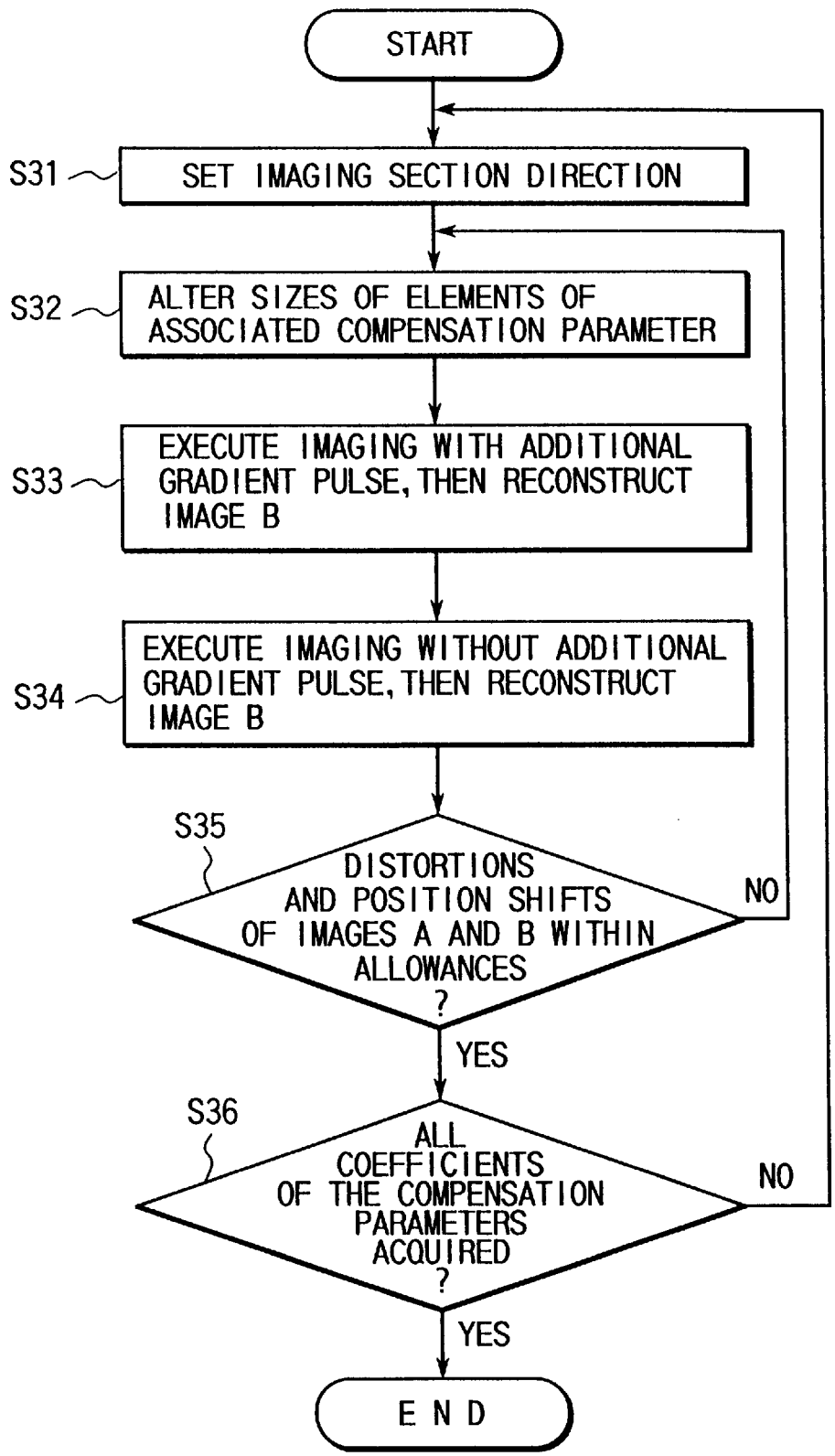
FIG. 7 is a flow chart showing a first modification of a procedure sequence for acquiring individual elements of $k_{Goffset}$ and $k_f$ in the first embodiment.
Figure 8:
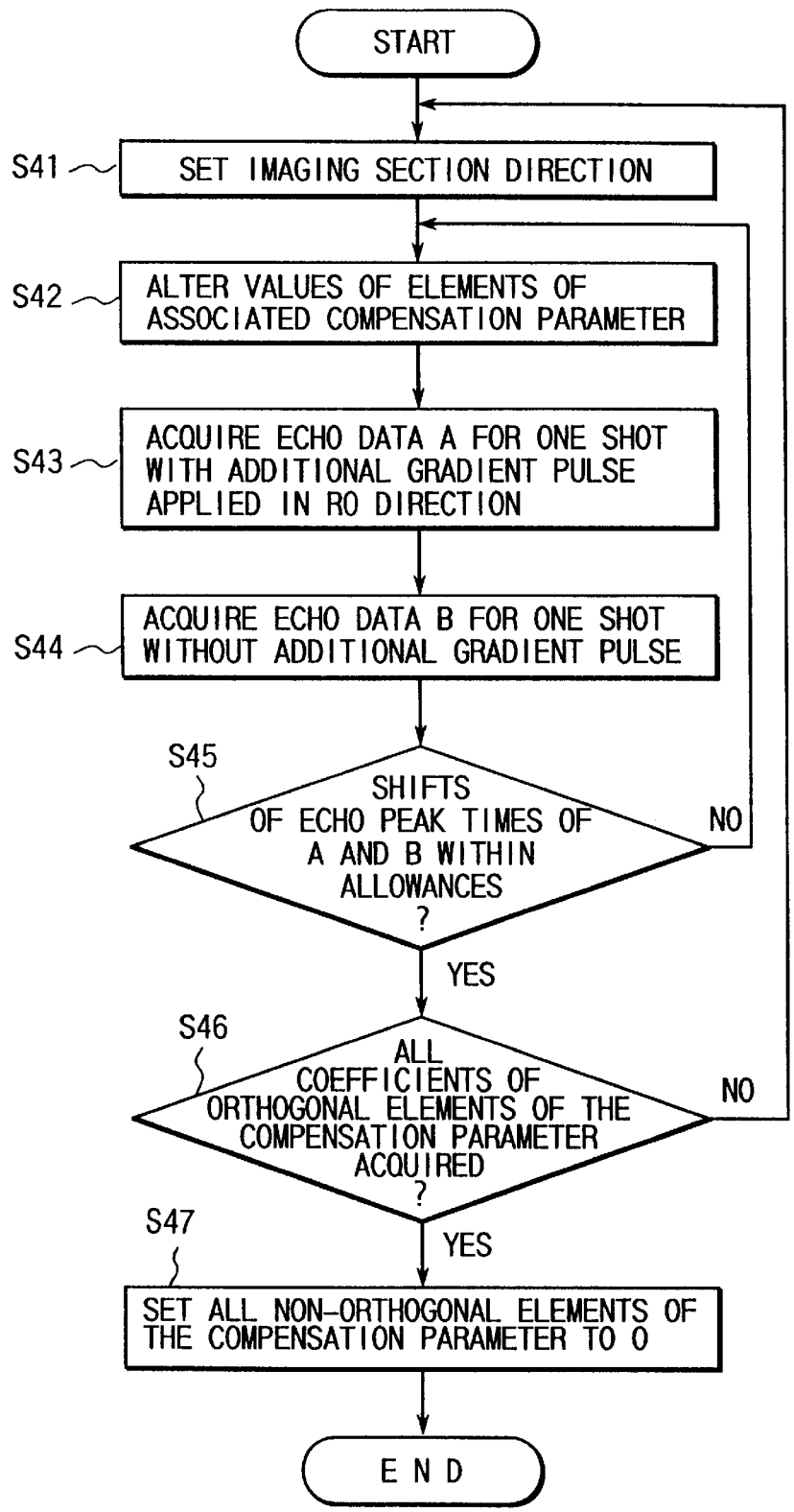
FIG. 8 is a flow chart illustrating a first modification of a procedure sequence for acquiring individual elements of $k_{Gcp}$ in the first embodiment.

FIG. 7 is a flow chart illustrating a first modification of the procedures for acquiring individual elements of $k_{Goffset}$ and $k_f$, and FIG. 8 is a flow chart illustrating a first modification of the procedures for acquiring individual elements of $k_{Gcp}$.

The first modification of the procedures of obtaining the individual elements of $k_{Goffset}$ and $k_f$ as shown in FIG. 7 is carried out as follows. First, the section direction for imaging is set in step S31. Here, one of three orthogonal sections (axial, coronal and sagital sections) is set as in step S11 in FIG. 5.

According to this modification, while the image distortion, position distortion and positional shift in the case where an additional gradient field pulse is applied are compared with those in the case where no additional gradient field pulse is applied (step S35), the element values of the compensation parameter associated with the set section direction are changed (step S32) to find the point which minimizes the image distortion and positional shift, thereby providing the proper element values. Note that step S33 shows a procedure of reconstructing the image A with the additional gradient field pulse applied, while step S34 shows a procedure of reconstructing the image B with no additional gradient field pulse applied. In step S35, the image distortion and positional shift are calculated based on the reconstructed images A and B.

This sequence of procedures is repeated while the section direction or the direction of the additional gradient field pulse is altered, until every element of $k_{Gcp}$ is acquired (step S36). It is to be noted however that as in step S17, measurement of any compensation parameter element, which is nearly zero or has a small variation from one apparatus to another, may be omitted.

The first modification of the procedures of obtaining the individual elements of $k_{Gcp}$ as shown in FIG. 8 is carried out as follows. First, the section direction for imaging is set in step S41.

According to this modification, while the shift in the time of an echo peak of an image in the case where an additional gradient field pulse is applied is compared with that in the case where no additional gradient field pulse is applied (step S45), the element values of the compensation parameter associated with the set section direction are changed (step S42) to find the point which minimizes the echo peak time, thereby providing the adequate element values. This is a simplified method which obtains only the orthogonal elements βxx, βyy and βzz of $k_{Gcp}$. When the section direction such that the read direction corresponds to the X channel is set, for example, the element value of the compensation parameter to be changed in step S43 is βxx. Step S42 shows a procedure of acquire echo data A for one excitation (one shot) by applying an additional gradient field pulse in the read direction. Step S44 shows a procedure of acquire echo data B for one excitation with no additional gradient field pulse applied. This scheme acquires the point where the peak times of the echoes A and B match each other, while the associated element values of $k_{Gcp}$ are changed.

This sequence of procedures is repeated while the section direction or the direction of the additional gradient field pulse is altered, until every orthogonal element of the compensation parameter $k_{Gcp}$ is acquired (step S46). Note that the values of the non-orthogonal elements which have not been measured (such as βxy and βyz) are all set to 0 (step S47).

Second Embodiment

Figure 9:
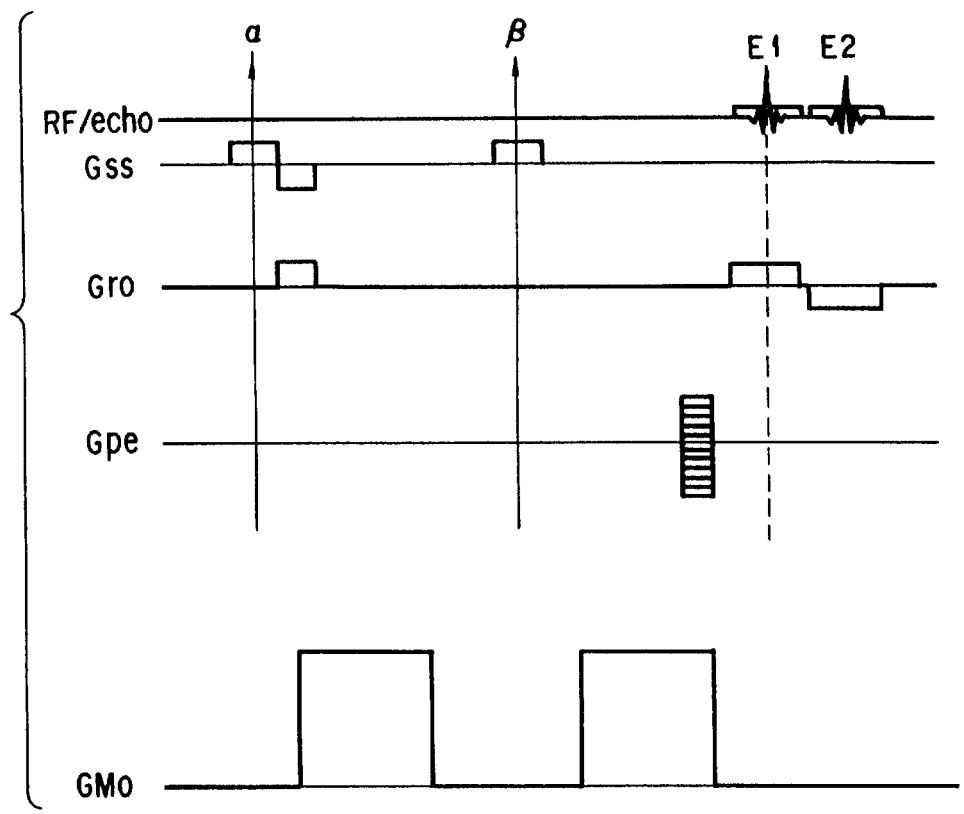
FIG. 9 is a diagram of a pulse sequence according to a second embodiment of this invention.
Figure 12:
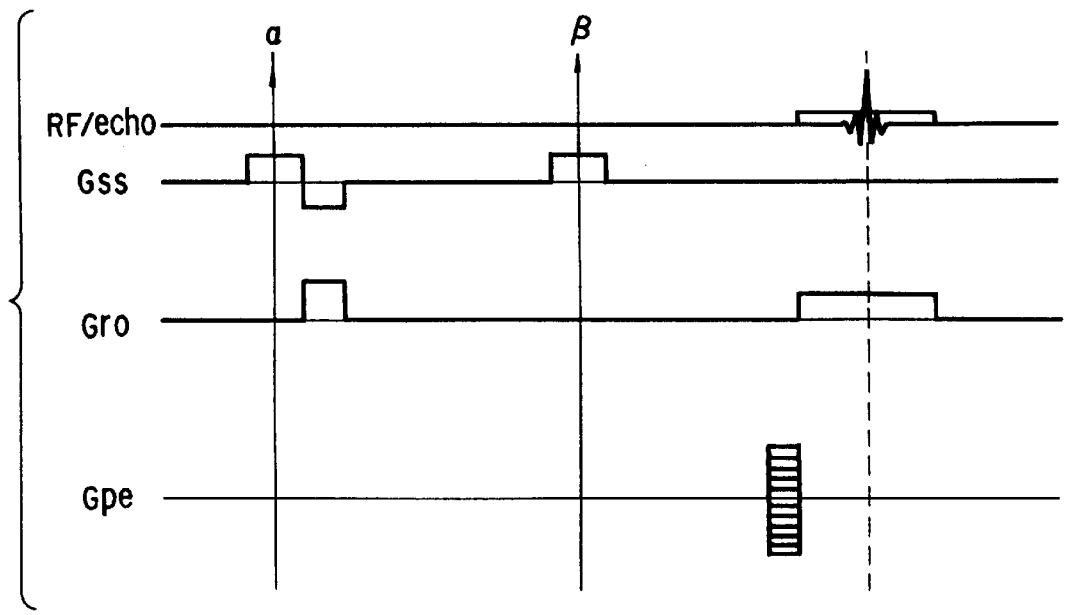
FIG. 12 is a diagram showing a pulse sequence of a spin echo scheme according to prior art.

A second embodiment of this invention will now be described. FIG. 9 is a diagram of a pulse sequence according to the second embodiment, and FIG. 10 is a flow chart illustrating procedures for obtaining individual elements of $k_{Goffset}$ $k_f$ and $k_{Gcp}$.

The second embodiment is the first embodiment whose sequence SA shown in FIG. 2 is replaced with the pulse sequence shown in FIG. 9.

In the pulse sequence of this embodiment, as shown in FIG. 9, the first echo is acquired around a so-called Hahn echo time at which the time from the excitation pulse to an RF inversion pulse is equal to the time from an RF inversion pulse to the first echo, and the second echo is acquired around a time shifted from the Hahn echo time by, for example, 5 ms.

Figure 10:
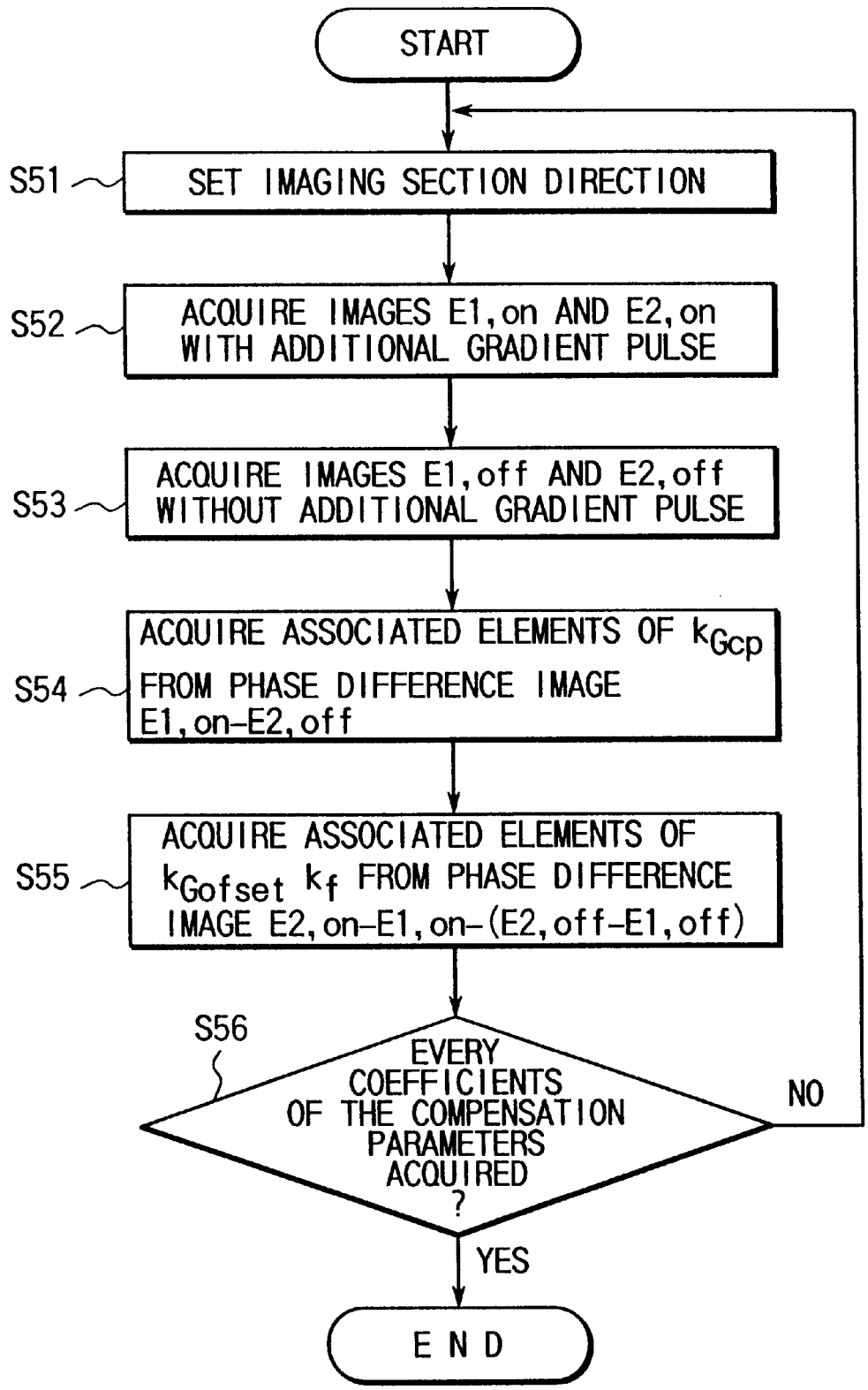
FIG. 10 is a flow chart illustrating procedures for obtaining individual elements of $k_{Goffset}$, $k_f$ and $k_{Gcp}$ in the second embodiment.

As shown in FIG. 10, after an imaging section is set in the same way as done in the first embodiment first (step S51), scanning according to the pulse sequence shown in FIG. 9 is executed while applying an additional gradient field pulse. Let E1,on denote an image obtained by the first echo and E2,on denote an image obtained by the second echo (step S52).

Next, similar scanning is performed with no additional gradient field pulse applied. Let E1, off denote an image obtained by the first echo and E2, off denote an image obtained by the second echo (step S53).

In step S54, a first phase difference image or E1,on–E1,off is obtained. This first phase difference image has a phase proportional to the amount of moment of the gradient field which has been generated by the additional gradient field pulse, so that associated elements of $k_{Gcp}$ can be obtained based on the linear component of the phase of this image (step S54).

In step S55, (E2,on–E1,on)–(E2,off–E1,off) is obtained for a second phase difference image or the phase of an associated pixel of each image. This second phase difference image has a phase proportional to the field distribution which has been generated by the additional gradient field pulse, so that associated elements of $k_{Goffset}$ can be obtained from the linear component of the phase of this image (step S56).

Although the second embodiment is designed to acquire all the elements of the compensation parameter, only those elements relating to imaging may be measured to promptly proceed to actual imaging, thereby shortening the measuring time.

A modification of the second embodiment will be discussed below.

Although the pulse sequence of the second embodiment has been described with reference to the case where the first echo is acquired around the Hahn echo time and the second echo is acquired around a time shifted from the Hahn echo time by, for example, 5 ms, the first echo may be acquired around a time different from the Hahn echo time and the second echo may be acquired around a time irrelevant to the Hahn echo time, or two echoes with different echo times may be acquired without using an RF inversion pulse.

In such a case, scanning is carried out with an additional gradient field pulse applied to acquire a first echo around a first echo time, with E1,on denoting an image obtained by the first echo, and to acquire a second echo around a second echo time with E2,on denoting an image obtained by the second echo. Next, similar scanning is carried out with no gradient field pulse applied, In this scanning, a third echo is acquired around the first echo time, with E1,off denoting an image obtained by the third echo, and a fourth echo is acquired around the second echo time with E2,off denoting an image obtained by the fourth echo.

The processes of obtaining first and second phase difference images may be the same as those discussed already.

Third Embodiment

A third embodiment of this invention will now be described.

While the first and second embodiments compensate for an unnecessary field distribution by a pulse sequence itself, such a compensation process, as already mentioned, can be accomplished by other schemes which do not involve alteration of the pulse sequence itself.

Figure 11:
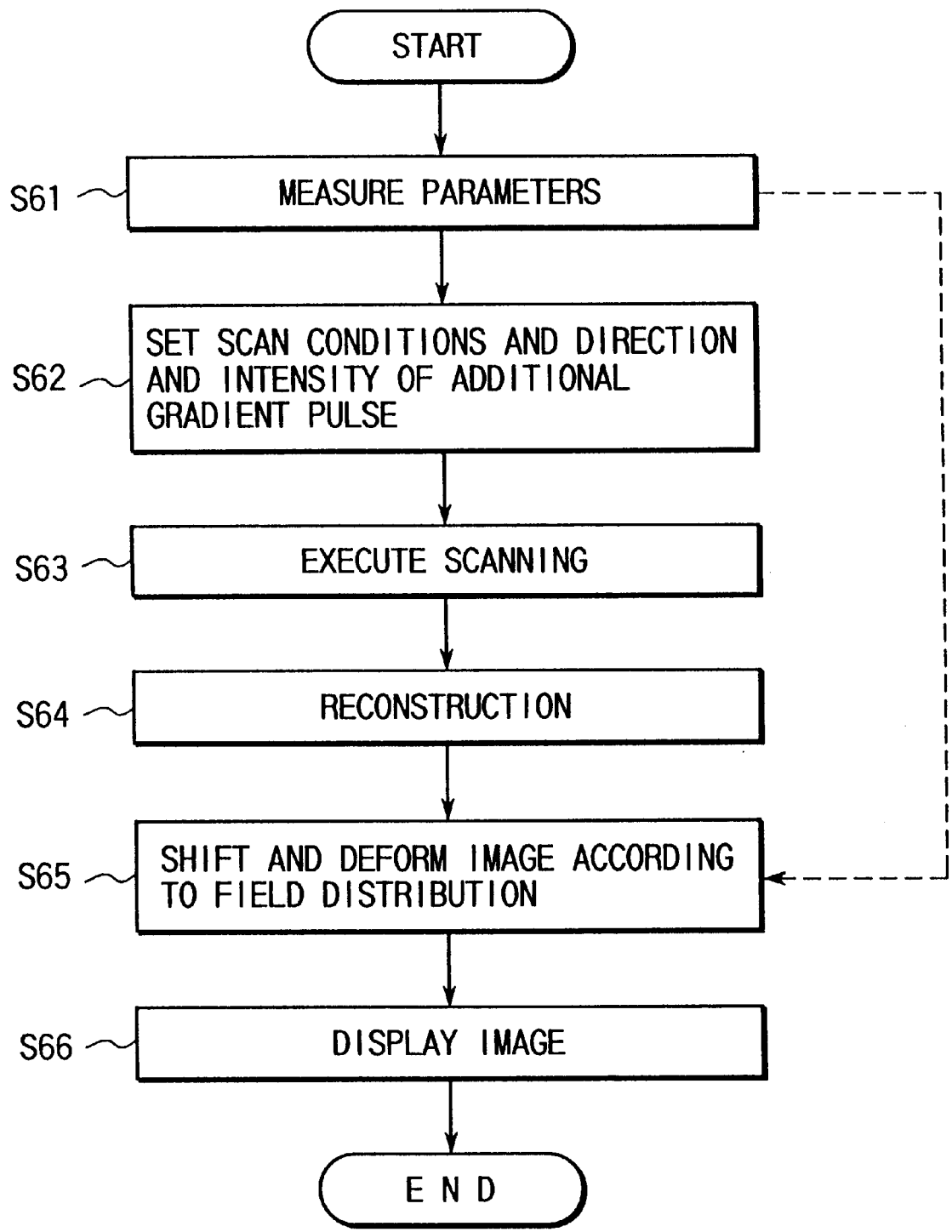
FIG. 11 is a flow chart depicting procedures for a compensation process in image processing after image reconstruction according to a third embodiment.

The third embodiment relates to an MRI apparatus which carries out the compensation process in an image reconstructing process without involving alteration of the pulse sequence itself. FIG. 11 is a flow chart illustrating procedures for the compensation process in the third embodiment.

The third embodiment compensates for image distortion by a process after image reconstruction by using parameters for compensating for a measured unnecessary field distribution, as per the first and second embodiments. As shown in FIG. 11, parameters are measured first (step S61). Then, scan conditions, and the direction and intensity of an additional gradient field pulse if necessary, are set (step S62). Scanning is conducted according to this setting (step S63). It is to be noted that no alteration of the pulse sequence for the above compensation process parameter is made.

Further, an image before compensation is prepared by the image reconstructing process associated with echo data obtained by scanning (step S64). Next, image distortion and the amount of the shift are predicted from the measured parameters and the scan conditions such as the type of the scanning and the echo interval, and the image is compensated based on the predicted values (step S65). Finally, the compensated image is displayed as an output image (step S66) or is stored on a storage medium.

The image compensation process in step S65 will be discussed more specifically. In the case where the shift of the center frequency caused by the additional gradient field pulse is df Hz, if the spin echo scheme is used as the imaging scheme and the echo data acquisition period is T seconds, the amount of the positional shift of the image is df·T pixels in the read direction (frequency direction). Therefore, the image should be moved by df·T pixels in the read direction toward the lower frequency side. The same processing can apply to the other elements.

According to this invention, as apparent from the foregoing description, image distortion and positional shift which occur due to application of an additional gradient field pulse can be suppressed. Further, it is possible to acquire an image with a small change in the phase components of the image. This can improve the phase compensation precision, and thus can reduce artifacts. Furthermore, it is possible to suppress a variation in image from one apparatus to another (more specifically, from one section to another). Accordingly, a high-quality and high-performance MRI apparatus can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
obtaining means for obtaining first data by scanning in which an additional gradient magnetic field is applied in addition to gradient magnetic fields necessary for imaging, and obtaining second data by scanning without application of the additional gradient magnetic field;
calculating means for calculating a parameter for compensation on the basis of the first and second data obtained by said obtaining means; and
compensating means for compensating deterioration of an image quality, caused by applying the additional gradient magnetic field, on the basis of the parameter.

2. A magnetic resonance imaging method comprising:
obtaining first data by MR scanning in which an additional motion image enhancement gradient magnetic field is applied;
obtaining second data by MR scanning without application of the additional motion enhancement gradient magnetic field;
calculating a parameter for MRI compensation on the basis of the first and second data;
compensating deterioration of MRI quality caused by applying the additional motion enhancement gradient magnetic field in subsequent diagnostic MRI scans, on the basis of the parameter;
said obtaining steps including:
measuring a first field distribution as said first data; and
measuring a second field distribution as said second data.

3. A magnetic resonance imaging method comprising:
obtaining first data by MR scanning in which an additional motion image enhancement gradient magnetic field is applied;
obtaining second data by MR scanning without application of the additional motion enhancement gradient magnetic field;
calculating a parameter for MRI compensation on the basis of the first and second data; and
compensating deterioration of MRI quality, caused by applying the additional motion enhancement gradient magnetic field in subsequent diagnostic MRI scans, on the basis of the parameter;
said obtaining steps including:
acquiring a first phase image as said first data; and
acquiring a second phase image as said second data.

4. A magnetic resonance imaging method comprising:
obtaining first data by MR scanning in which an additional motion image enhancement gradient magnetic field is applied;
obtaining second data by MR scanning without application of the additional motion enhancement gradient magnetic field;
calculating a parameter for MRI compensation on the basis of the first and second data; and
compensating deterioration of MRI quality, caused by applying the additional motion enhancement gradient magnetic field in subsequent diagnostic MRI scans on the basis of the parameter;
said obtaining steps including:
acquiring a first echo signal as said first data; and
acquiring a second echo signal as said second data.

5. A magnetic resonance imaging method comprising:
obtaining first data by MR scanning in which an additional motion image enhancing gradient magnetic field is applied;
obtaining second data by MR scanning without application of said additional motion enhancement gradient magnetic field;
calculating a parameter for MRI compensation on the basis of the first and second data; and
compensating deterioration of MRI quality, caused by applying the additional motion enhancing gradient magnetic field during subsequent diagnostic MRI scans on the basis of the parameter;
said obtaining steps including:
acquiring a first echo with a Hahn echo time as an echo center and a second echo with a time other than said Hahn echo time as an echo center by applying said additional motion enhancing gradient field pulse, said first and second echos providing said first data; and
acquiring a third echo with said Hahn echo time as an echo center and a fourth echo with a time other than said Hahn echo time as an echo center without applying said additional motion enhancing gradient field pulse, said third and fourth echos providing said second data.

6. A magnetic resonance imaging method comprising:
obtaining first data by MR scanning in which an additional motion image enhancing gradient magnetic field is applied;
acquiring second data by scanning without application of the additional motion enhancing gradient magnetic field;
calculating a parameter for MRI compensation on the basis of the first and second data; and
compensating deterioration of MRI quality, caused by applying the additional motion enhancing gradient magnetic field, on the basis of the parameter;
said obtaining steps including:
acquiring a first echo with a first echo time as an echo center and a second echo with a second echo time as an echo center by applying said additional gradient field pulse, said first and second echos providing said first data; and
acquiring a third echo with said first echo time as an echo center and a fourth echo with said second echo time as an echo center without applying said additional gradient field pulse, said third and fourth echos providing said second data.

7. A magnetic resonance imaging method comprising:
obtaining first data by MR scanning in which an additional motion image enhancing gradient magnetic field is applied;
obtaining second data by MR scanning without application of the additional motion enhancing gradient magnetic field;
calculating a parameter for MRI compensation on the basis of the first and second data; and
compensating deterioration of MRI quality, caused by applying the additional motion enhancing gradient magnetic field, during subsequent diagnostic MRI scans on the basis of the parameter.

8. A magnetic resonance imaging apparatus comprising:
obtaining means for obtaining first data by scanning in which an additional gradient magnetic field is applied in addition to gradient magnetic fields necessary for imaging, and obtaining second data by scanning without application of the additional gradient magnetic field;
calculating means for calculating a parameter for compensation on the basis of the first and second data obtained by said obtaining means; and
compensating means for compensating deterioration of an image quality, caused by applying the additional gradient magnetic field, on the basis of the parameter;
said obtaining means including:
first acquisition means for acquiring a first echo with a Hahn echo time as an echo center and a second echo with a time other than said Hahn echo time as an echo center by applying said additional gradient field pulse, said first and second echos being regarded as said first data; and
second acquisition means for acquiring a third echo with said Hahn echo time as an echo center and a fourth echo with time other than said Hahn echo time as an echo center without applying said additional gradient field pulse, said third and fourth echos being regarded as said second data.

9. The apparatus according to claim 8 further comprising storage means for storing said parameter for compensation calculated by said calculation means,
wherein said compensating means compensates deterioration of an image quality, caused by applying the additional gradient magnetic field, on the basis of the parameter stored in said storage means.

10. The apparatus according to claim 8 wherein said compensating means applies a compensation gradient field having an intensity corresponding to said parameter.

11. The apparatus according to claim 8 wherein said compensating means changes a center frequency of a detected echo signal in accordance with said parameter.

12. The apparatus according to claim 8 wherein said compensating means is made of image processing means for deforming or shifting a reconstructed image in accordance with said parameter.

13. A magnetic resonance imaging apparatus comprising:
obtaining means for obtaining first data by scanning in which an additional gradient magnetic field is applied in addition to gradient magnetic fields necessary for imaging, and acquiring second data by scanning without application of the additional gradient magnetic field;
calculating means for calculating a parameter for compensation on the basis of the first and second data obtained by said obtaining means; and compensating means for compensating deterioration of an image quality, caused by applying the additional gradient magnetic field, on the basis of the parameter;

said obtaining means including:

first acquisition means for acquiring a first echo with a first echo time as an echo center and a second echo with a second echo time as an echo center by applying said additional gradient field pulse, said first and second echos being regarded as said first data; and second acquisition means for acquiring a third echo with said first echo time as an echo center and a fourth echo with said second echo time as an echo center without applying said additional gradient field pulse, said third and fourth echos being regarded as said second data.

14. The apparatus according to claim 13, further comprising storage means for storing said parameter for compensation calculated by said calculation means, wherein said compensating means compensates deterioration of an image quality, caused by applying the additional gradient magnetic field, on the basis of the parameter stored in said storage means.

15. The apparatus according to claim 13, wherein said compensating means applies a compensation gradient field having an intensity corresponding to said parameter.

16. The apparatus according to claim 13, wherein said compensating means changes a center frequency of a detected echo signal in accordance with said parameter.

17. The apparatus according to claim 13, wherein said compensating means is made of image processing means for deforming or shifting a reconstructed image in accordance with said parameter.

18. A magnetic resonance imaging apparatus comprising:

obtaining means for obtaining first data by scanning in which an additional gradient magnetic field is applied in addition to gradient magnetic fields necessary for imaging, and obtaining second data by scanning without application of the additional gradient magnetic field;

calculating means for calculating a parameter for compensation on the basis of the first and second data obtained by said obtaining means; and compensating means for compensating deterioration of an image quality, caused by applying the additional gradient magnetic field, on the basis of the parameter;

said obtaining means including:

first measuring means for measuring a first field distribution as said first data by applying said additional gradient field pulse; and second measuring means for measuring a second field distribution as said second data without applying said additional gradient pulse.

19. The apparatus according to claim 18, further comprising storage means for storing said parameter for compensation calculated by said calculation means, wherein said compensating means compensates deterioration of an image quality, caused by applying the additional gradient magnetic field, on the basis of the parameter stored in said storage means.

20. The apparatus according to claim 18, wherein said compensating means applies a compensation gradient field having an intensity corresponding to said parameter.

21. The apparatus according to claim 18, wherein said compensating means changes a center frequency of a detected echo signal in accordance with said parameter.

22. The apparatus according to claim 18, wherein said compensating means is made of image processing means for deforming or shifting a reconstructed image in accordance with said parameter.

23. A magnetic resonance imaging apparatus comprising:

obtaining means for obtaining first data by scanning in which an additional gradient magnetic field is applied in addition to gradient magnetic fields necessary for imaging, and obtaining second data by scanning without application of the additional gradient magnetic field;

calculating means for calculating a parameter for compensation on the basis of the first and second data obtained by said obtaining means; and compensating means for compensating deterioration of an image quality, caused by applying the additional gradient magnetic field, on the basis of the parameter;

said obtaining means including:

first acquisition means for acquiring a first phase image as said first data by applying said additional gradient field pulse; and second acquisition means for acquiring a second phase image as said second data without applying said additional gradient field pulse.

24. The apparatus according to claim 23 further comprising storage means for storing said parameter for compensation calculated by said calculation means, wherein said compensating means compensates deterioration of an image quality, caused by applying the additional gradient magnetic field, on the basis of the parameter stored in said storage means.

25. The apparatus according to claim 23 wherein said compensating means applies a compensation gradient field having an intensity corresponding to said parameter.

26. The apparatus according to claim 23 wherein said compensating means changes a center frequency of a detected echo signal in accordance with said parameter.

27. The apparatus according to claim 23 wherein said compensating means is made of image processing means for deforming or shifting a reconstructed image in accordance with said parameter.

28. A magnetic resonance imaging apparatus comprising:

obtaining means for obtaining first data by scanning in which an additional gradient magnetic field is applied in addition to gradient magnetic fields necessary for imaging, and obtaining second data by scanning without application of the additional gradient magnetic field;

calculating means for calculating a parameter for compensation on the basis of the first and second data obtained by said obtaining means; and compensating means for compensating deterioration of an image quality, caused by applying the additional gradient magnetic field, on the basis of the parameter;

said obtaining means including:

first acquisition means for acquiring a first echo signal as said first data by applying said additional gradient field pulse; and second acquisition means for acquiring a second echo signal as said second data without applying said additional gradient field pulse.

29. The apparatus according to claim 28 further comprising storage means for storing said parameter for compensation calculated by said calculation means, wherein said compensating means compensates deterioration of an image quality, caused by applying the additional gradient magnetic field, on the basis of the parameter stored in said storage means.

30. The apparatus according to claim 28 wherein said compensating means applies a compensation gradient field having an intensity corresponding to said parameter.

31. The apparatus according to claim 28 wherein said compensating means changes a center frequency of a detected echo signal in accordance with said parameter.

32. The apparatus according to claim 28 wherein said compensating means is made of image processing means for deforming or shifting a reconstructed image in accordance with said parameter.

* * * * *